US009083121B2

(12) United States Patent
DeGraaff et al.

(10) Patent No.: US 9,083,121 B2
(45) Date of Patent: Jul. 14, 2015

(54) DIODE-INCLUDED CONNECTOR, PHOTOVOLTAIC LAMINATE AND PHOTOVOLTAIC ASSEMBLY USING SAME

(75) Inventors: David DeGraaff, Mountain View, CA (US); Adam Detrick, Petaluma, CA (US)

(73) Assignee: SunPower Corporation, San Jose, CA (US)

( * ) Notice: Subject to any disclaimer, the term of this patent is extended or adjusted under 35 U.S.C. 154(b) by 513 days.

(21) Appl. No.: 12/972,153

(22) Filed: Dec. 17, 2010

(65) Prior Publication Data

US 2012/0152302 A1   Jun. 21, 2012

(51) Int. Cl.

| | | |
|---|---|---|
| *H01L 31/042* | (2014.01) | |
| *H01R 13/66* | (2006.01) | |
| *H01L 31/05* | (2014.01) | |
| *H02S 40/34* | (2014.01) | |
| *H02S 40/36* | (2014.01) | |
| *H01L 31/044* | (2014.01) | |
| *H01R 13/52* | (2006.01) | |

(52) U.S. Cl.
CPC .......... *H01R 13/6641* (2013.01); *H01L 31/044* (2014.12); *H01L 31/0504* (2013.01); *H02S 40/34* (2014.12); *H02S 40/36* (2014.12); *H01R 13/52* (2013.01); *Y02E 10/50* (2013.01)

(58) Field of Classification Search
CPC ... H01L 31/05; H01L 31/044; H01R 13/6641
USPC ................................................. 136/243–265
See application file for complete search history.

(56) References Cited

U.S. PATENT DOCUMENTS

| | | | |
|---|---|---|---|
| 4,257,821 | A | 3/1981 | Kelly et al. |
| 4,312,114 | A * | 1/1982 | Schoolar .......................... 438/73 |
| 4,567,316 | A | 1/1986 | Hollaus et al. |
| 4,577,051 | A | 3/1986 | Hartman |
| 5,012,160 | A | 4/1991 | Dunn Thompson |
| 5,290,366 | A * | 3/1994 | Riermeier et al. ............. 136/244 |
| 5,459,996 | A | 10/1995 | Malloy, III et al. |
| 5,616,185 | A | 4/1997 | Kukulka |
| 6,013,985 | A | 1/2000 | Green et al. |

(Continued)

OTHER PUBLICATIONS

International Search Report for Application No. PCT/US2011/061010, Mar. 28, 2012, 2 sheets.

(Continued)

*Primary Examiner* — Jeffrey T Barton
*Assistant Examiner* — Niki Bakhtiari
(74) *Attorney, Agent, or Firm* — Okamoto & Benedicto LLP

(57) ABSTRACT

One embodiment relates to a connector that includes a diode. The diode has an anode and a cathode. The connector further includes a first electrical connection which connects to the anode, a second electrical connection which also connects to the anode, and a third electrical connection which connects to the cathode. Another embodiment relates to a photovoltaic laminate which includes a string of photovoltaic cells and three electrical conductors extending out of two discrete penetrations of the laminate. A first electrical conductor is connected to a first end of the string, a second electrical conductor is connected to a second end of the string, and a third electrical conductor is also connected to the second end of the string. The first and third electrical conductors extend out of the first discrete penetration, while the second electrical conductor extends out of the second discrete penetration. Other features and embodiments are also disclosed.

4 Claims, 18 Drawing Sheets

600

(56) References Cited

U.S. PATENT DOCUMENTS

| | | | |
|---|---|---|---|
| 6,034,322 A | 3/2000 | Pollard | |
| 6,087,650 A | 7/2000 | Dage | |
| 6,087,991 A | 7/2000 | Kustas | |
| 6,130,465 A | 10/2000 | Cole | |
| 6,218,606 B1 * | 4/2001 | Morizane et al. | 136/251 |
| 6,355,873 B1 | 3/2002 | Ishikawa | |
| 6,486,391 B2 | 11/2002 | Karg | |
| 6,573,659 B2 | 6/2003 | Toma et al. | |
| 6,635,507 B1 | 10/2003 | Boutros et al. | |
| 7,732,706 B1 | 6/2010 | Mardesich | |
| 2002/0043279 A1 | 4/2002 | Karg | |
| 2002/0053879 A1 | 5/2002 | Thoma et al. | |
| 2002/0164834 A1 | 11/2002 | Boutros et al. | |
| 2005/0183765 A1 | 8/2005 | Ho et al. | |
| 2006/0289054 A1 | 12/2006 | Iverson et al. | |
| 2007/0113884 A1 | 5/2007 | Kinsey et al. | |
| 2008/0000523 A1 | 1/2008 | Hilgarth et al. | |
| 2008/0096427 A1 * | 4/2008 | Deguchi | 439/620.01 |
| 2008/0115911 A1 | 5/2008 | Duesterhoeft | |
| 2008/0156365 A1 * | 7/2008 | Scholz et al. | 136/251 |
| 2008/0314432 A1 | 12/2008 | Paulson et al. | |
| 2009/0025778 A1 | 1/2009 | Rubin et al. | |
| 2009/0142945 A1 | 6/2009 | Duesterhoeft | |
| 2009/0215304 A1 | 8/2009 | Faust et al. | |
| 2009/0283137 A1 | 11/2009 | Croft et al. | |
| 2010/0051086 A1 | 3/2010 | Keshner et al. | |
| 2010/0146878 A1 | 6/2010 | Koch et al. | |
| 2010/0243038 A1 | 9/2010 | Kukulka | |
| 2011/0019349 A1 | 1/2011 | Pfeffer | |

OTHER PUBLICATIONS

Extended European search report for EP Application No. 11848798.2, mailed May 9, 2014, 6 sheets.

* cited by examiner

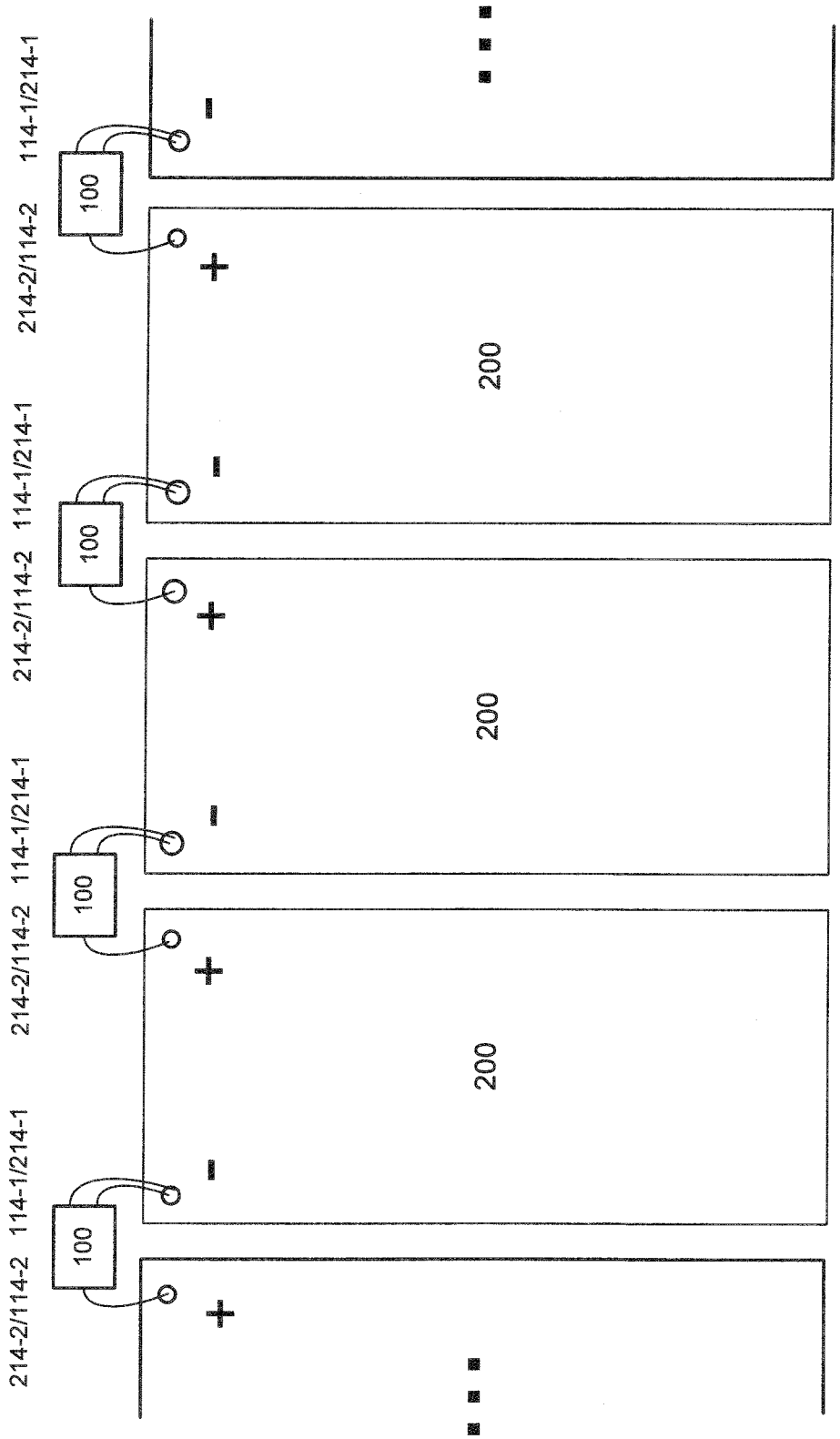

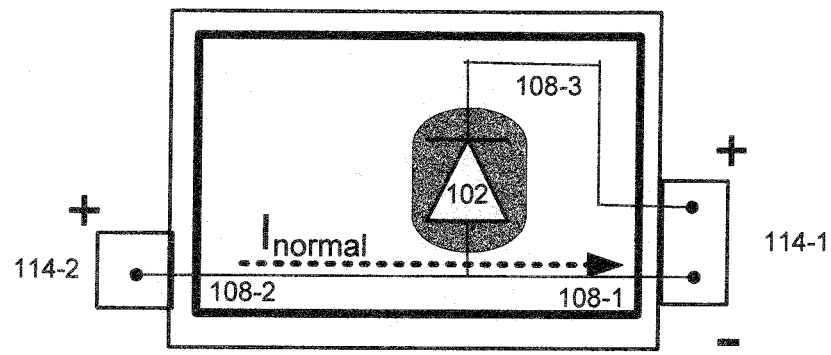
Reverse Bias on Diode     FIG. 5A     100
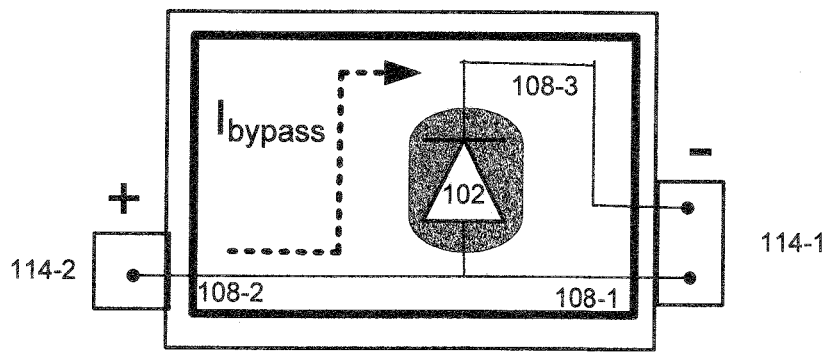
Forward Bias on Diode     FIG. 5B     100

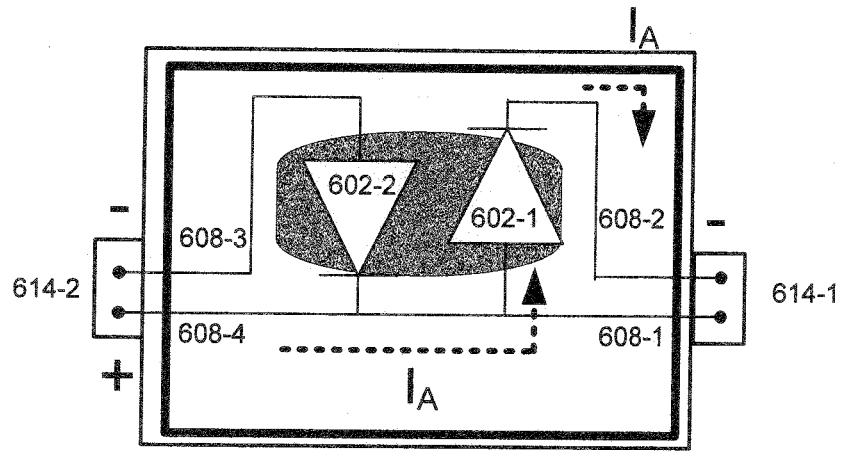
FIG. 10A            600
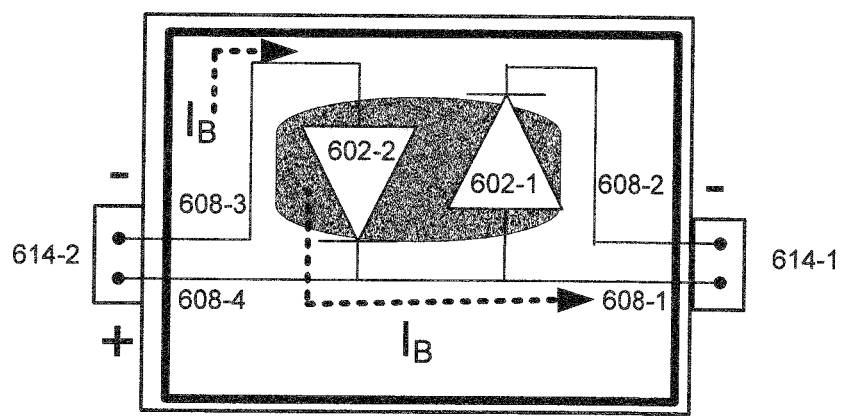
FIG. 10B            600

DIODE-INCLUDED CONNECTOR, PHOTOVOLTAIC LAMINATE AND PHOTOVOLTAIC ASSEMBLY USING SAME

BACKGROUND OF THE INVENTION

1. Field of the Invention

The present invention relates generally to circuit devices and photovoltaic module assemblies.

2. Description of the Background Art

Photovoltaic (PV) cells, also referred to as "solar cells," are well known devices for converting solar radiation to electrical energy. Photovoltaic cells may be packaged together in a photovoltaic module.

A conventional photovoltaic module may include a series of interconnected solar cells in a laminate. Typically, metal tabs are electrically connected to ends of the series and exit from the backside at the top center of the laminate. The metal tabs enter an external junction box which is attached to the backside at the top center of the laminate. In the junction box, input and output cables are attached to the tabs to get power from the module, and a diode may be configured to bypass cells in the module, if necessary. These elements relating to the junction box are expensive, and there are substantial installation costs to routing and managing the junction box cables.

It is highly desirable to improve photovoltaic modules such that they may be produced cost-effectively and installed more efficiently.

SUMMARY

One embodiment relates to a connector that includes a diode. The diode has an anode and a cathode. The connector further includes a first electrical connection which connects to the anode, a second electrical connection which also connects to the anode, and a third electrical connection which connects to the cathode.

Another embodiment relates to a photovoltaic laminate which includes a string of photovoltaic cells and three electrical conductors extending out of two discrete penetrations of the laminate. A first electrical conductor is connected to a first end of the string, a second electrical conductor is connected to a second end of the string, and a third electrical conductor is also connected to the second end of the string. The first and third electrical conductors extend out of the first discrete penetration, while the second electrical conductor extends out of the second discrete penetration.

Another embodiment relates to a photovoltaic assembly that includes two of the aforementioned photovoltaic laminates, each including three electrical conductors extending out of two discrete weatherized penetrations. The two photovoltaic laminates are interconnected using the aforementioned diode-included connector with three electrical connections.

Another embodiment relates to a connector that includes a diode. The diode has an anode and a cathode. The connector further includes a first electrical connection which connects to the anode, a second electrical connection which also connects to the anode, a third electrical connection which connects to the cathode, and a fourth electrical connection which connects to the anode.

Another embodiment relates to a photovoltaic laminate which includes a string of photovoltaic cells and two electrical conductors extending out of two discrete penetrations of the laminate. A first electrical conductor is connected to a first end of the string, and a second electrical conductor is connected to a second end of the string. The first electrical conductor extends out of the first discrete penetration, while the second electrical conductor extends out of the second discrete penetration.

Another embodiment relates to a photovoltaic assembly that includes two of the aforementioned photovoltaic laminates, each including two electrical conductors extending out of two discrete weatherized penetrations. The two photovoltaic laminates are interconnected using the aforementioned diode-included connector with four electrical connections and also using an external cable.

Another embodiment relates to a connector that includes two diodes. The connector includes a first electrical connection which connects to the anode of the first diode and the cathode of the second diode and a second electrical connection which connects to the cathode of the first diode. In addition, the connector includes a third electrical connection which connects to the anode of the second diode and a fourth electrical connection which connects to the cathode of the second diode and the anode of the first diode.

Another embodiment relates to a photovoltaic laminate which includes a string of photovoltaic cells and four electrical conductors extending out of at least two discrete penetrations of the laminate. A first electrical conductor is connected to a first end of the string, and a second electrical conductor is connected to an interior point of the string. In addition, a third electrical conductor is also connected to the interior point of the string, and a fourth electrical conductor is connected to a second end of the string.

Another embodiment relates to a photovoltaic assembly that includes two of the aforementioned photovoltaic laminates, each including four electrical conductors extending out of discrete weatherized penetrations. The two photovoltaic laminates are interconnected using a connector that includes two diodes.

These and other embodiments and features of the present invention will be readily apparent to persons of ordinary skill in the art upon reading the entirety of this disclosure, which includes the accompanying drawings and claims.

BRIEF DESCRIPTION OF THE DRAWINGS

FIG. 3 is schematic diagram of a photovoltaic assembly in accordance with the first embodiment of the invention.

FIG. 5A is a schematic diagram showing the diode-included connector of FIG. 1 in a normal operation mode.

FIG. 5B is a schematic diagram showing the diode-included connector of FIG. 1 in a bypass operation mode.

FIG. 10A is a schematic diagram showing the diode-included connector of FIG. 6 in a first partial bypass mode.

FIG. 10B is a schematic diagram showing the diode-included connector of FIG. 6 in a second partial bypass mode.

The use of the same reference label in different drawings indicates the same or like components.

DETAILED DESCRIPTION

The present patent application discloses innovations relating to diode-included connectors, photovoltaic laminates, and photovoltaic assemblies utilizing the connectors and laminates. The innovations disclosed herein may be used advantageously to reduce the installation costs otherwise necessitated by the routing and managing a large number of junction box cables. In addition, in comparison to embedding bypass diodes in the laminate, the approach disclosed in the present application enables a defective diode to be readily switched out, thus avoiding the need to replace an entire module if its diode fails. Furthermore, a diode operating in a connector as disclosed herein can dissipate heat more readily without disadvantageously heating the module.

Figure 1:
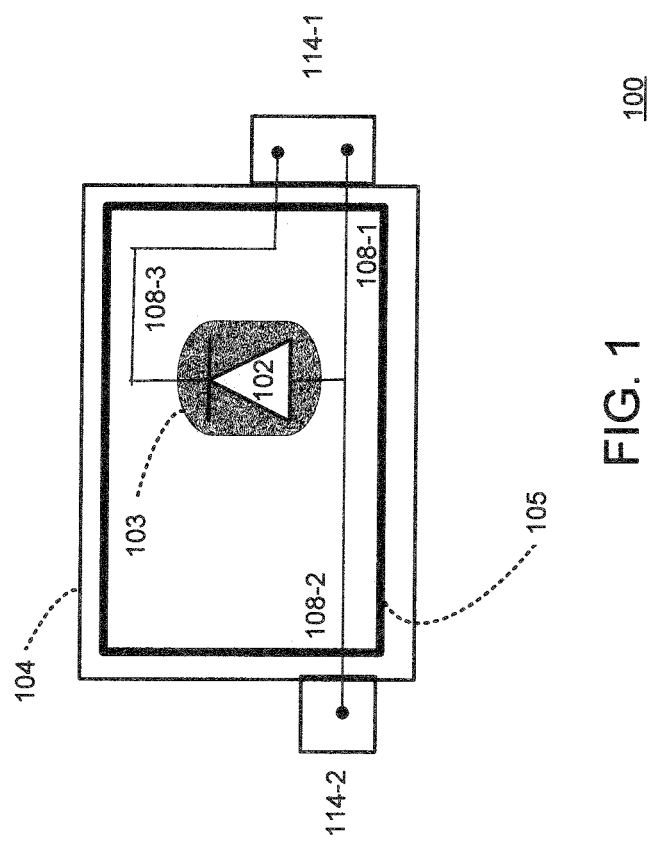
FIG. 1 is a schematic diagram of a diode-included connector in accordance with a first embodiment of the invention.

FIG. 1 is a schematic diagram of a diode-included connector 100 in accordance with a first embodiment of the invention. As shown, the diode-included connector 100 may include a diode device 102 in an environmentally-protected housing 104. For example, an O-ring 105 may be used to prevent external moisture from entering the interior of the housing 104. Alternatively, an encapsulant (such as a potting material) may be inserted into the housing 104 to weatherize the connector 100. The connector 100 may also be configured such that it can be disassembled with or without tools to replace or otherwise service the diode. For example, one or more screws (or other re-openable fastening mechanism) may be used to close the housing. These screws may be unscrewed (or other mechanism opened) so as to gain access to the interior of the diode-included connector 100 for replacing or otherwise servicing the diode device 102. A strain relief mechanism may also be incorporated into the connector such that forces applied to the external conductors are not transferred to the internal connection points.

The diode device 102 includes an anode and a cathode. When forward biased, the diode device 102 typically allows electrical current to flow through it from the anode to the cathode. When reverse biased, the diode device 102 typically prevents electrical current from flowing through it. A heat sink 103 may be thermally coupled to the diode device 102 so as to provide passive cooling of the diode device 102.

The diode-included connector 100 further includes a first electrical connection 108-1 which connects to the anode, a second electrical connection 108-2 which also connects to the anode, and a third electrical connection 108-3 which connects to the cathode. A first port 114-1 may be configured to electrically connect to the first and third electrical connections (108-1 and 108-3). In one implementation, the first port may be configured as a coaxial connector so as to connect to a coaxial cable (the cable and connectors being configured with sufficient amperage carrying capacity for the electrical current flowing through them during peak operation). A second port 114-2 may be configured to electrically connect to the second electrical connection 108-2.

Figure 2:
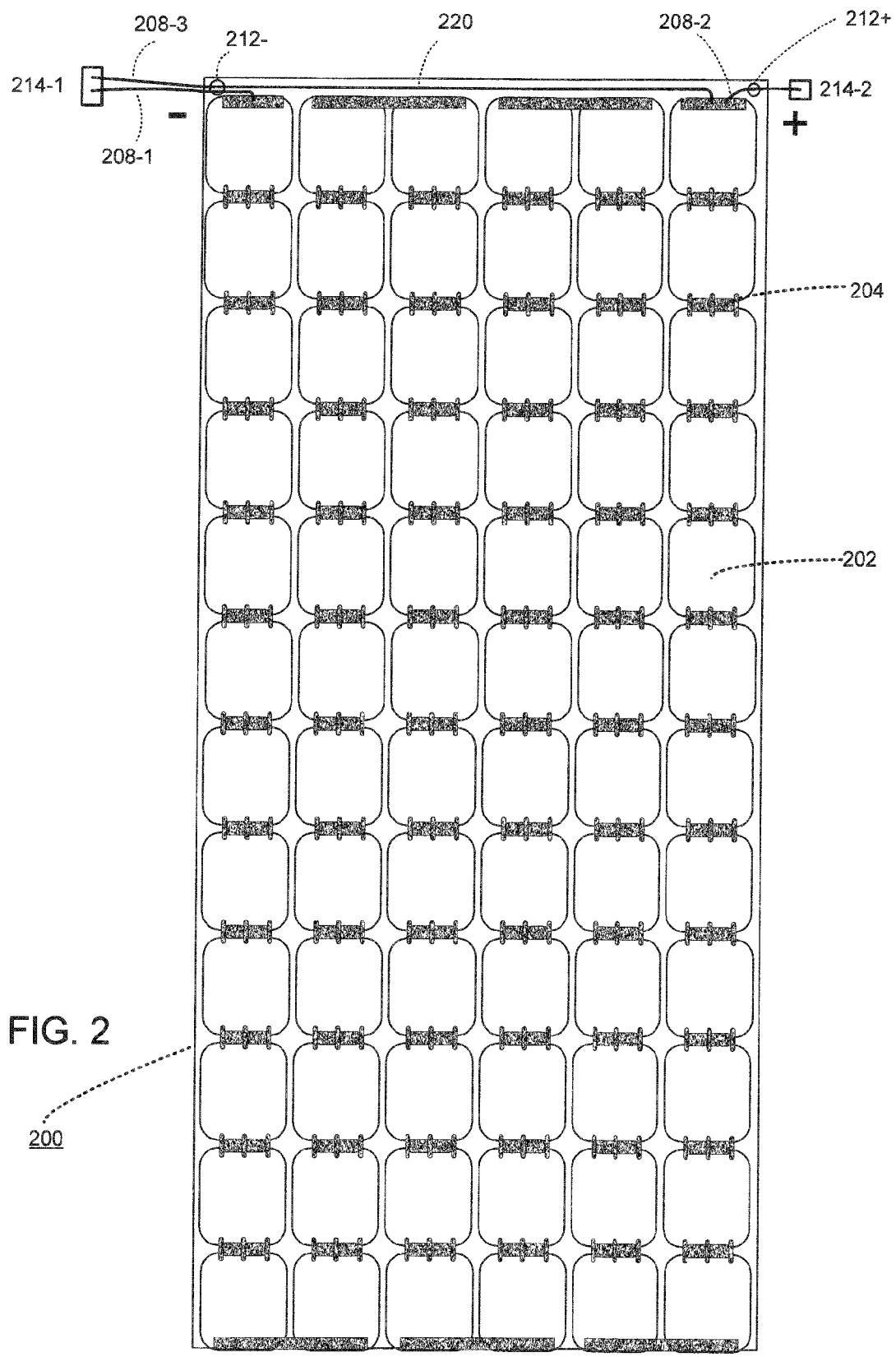
FIG. 2 is schematic diagram of a photovoltaic laminate in accordance with the first embodiment of the invention.

FIG. 2 is schematic diagram of a photovoltaic laminate 200 in accordance with the first embodiment of the invention. The photovoltaic laminate 200 includes a string of photovoltaic (solar) cells 202 connected in series. Each photovoltaic cell 202 in the string may be configured as a large-area PN-junction, and electrically-conductive interconnections 204 may be configured to connect a negative contact of one cell in the string to a positive contact of the next cell in the string. A first end of the string may be at its negative polarity end (−) of the string, and a second end of the string may be at its positive polarity end (+).

In accordance with an embodiment of the invention, the photovoltaic laminate 200 may include a first discrete penetration 212− in a corner of the laminate near the first end (the negative polarity end) of the string and a second discrete penetration 212+ in a corner of the laminate near the second end (the positive polarity end) of the string. A sealant may be inserted into the first and second discrete penetrations (212− and 212+) so as to seal them from external moisture. A strain relief may also be incorporated into the discrete penetration such that forces applied to the external conductors are not transferred to the discrete connection point.

A first electrical conductor 208-1 may be electrically connected to the first end of the string and may be configured to extend out of the first discrete penetration. A second electrical conductor 208-2 may be electrically connected to the second end of the string and may be configured to extend out of the second discrete penetration. A third electrical conductor 208-3 may be electrically connected to the second end of the string and may be configured to extend out of the first discrete penetration. In one implementation, a metal bus bar 220 may be embedded in the photovoltaic laminate and configured to connect the second end of the string to the second electrical conductor 208-2. An alternate embodiment which utilizes an external cable, instead of an internal bus bar, is described below in relation to FIGS. 11-13.

In one implementation, a first connector 214-1 may be configured at an end of the first and third electrical conductors (208-1 and 208-3). The first connector 214-1 may be of a type so as to connect with the first port 114-1 of the diode-included connector 100 of FIG. 1. For example, if the first port 114-1 is a female coaxial-type connector, then the first connector 214-1 may be matching male coaxial-type connector. When the first connector 214-1 and first port 114-1 are connected, the first electrical conductor 208-1 is connected to the first electrical connection 108-1, and the third electrical conductor 208-3 is connected to the third electrical connection 108-3.

In addition, a second connector 214-2 may be configured at an end of the second electrical conductor (208-2). The second connector 214-2 may be of a type so as to connect with the second port 114-2 of the diode-included connector 100 of FIG. 1. When the second connector 214-2 and second port 114-2 are connected, the second electrical conductor 208-2 is connected to the second electrical connection 108-2.

FIG. 3 is schematic diagram of a photovoltaic assembly 300 in accordance with the first embodiment of the invention. As shown, a plurality of photovoltaic laminates 200, each generally configured within a solar module, are connected in series using the diode-included connectors 100. As indicated, each diode-included connector 100 has a first port 114-1 which is connected to the first connector 214-1 of a photovoltaic laminate 200 (to the right of the connector in the figure) and a second port 114-2 which is connected to the second connector 214-2 of another photovoltaic laminate 200 (to the left of the connector in the figure).

Figure 4A:
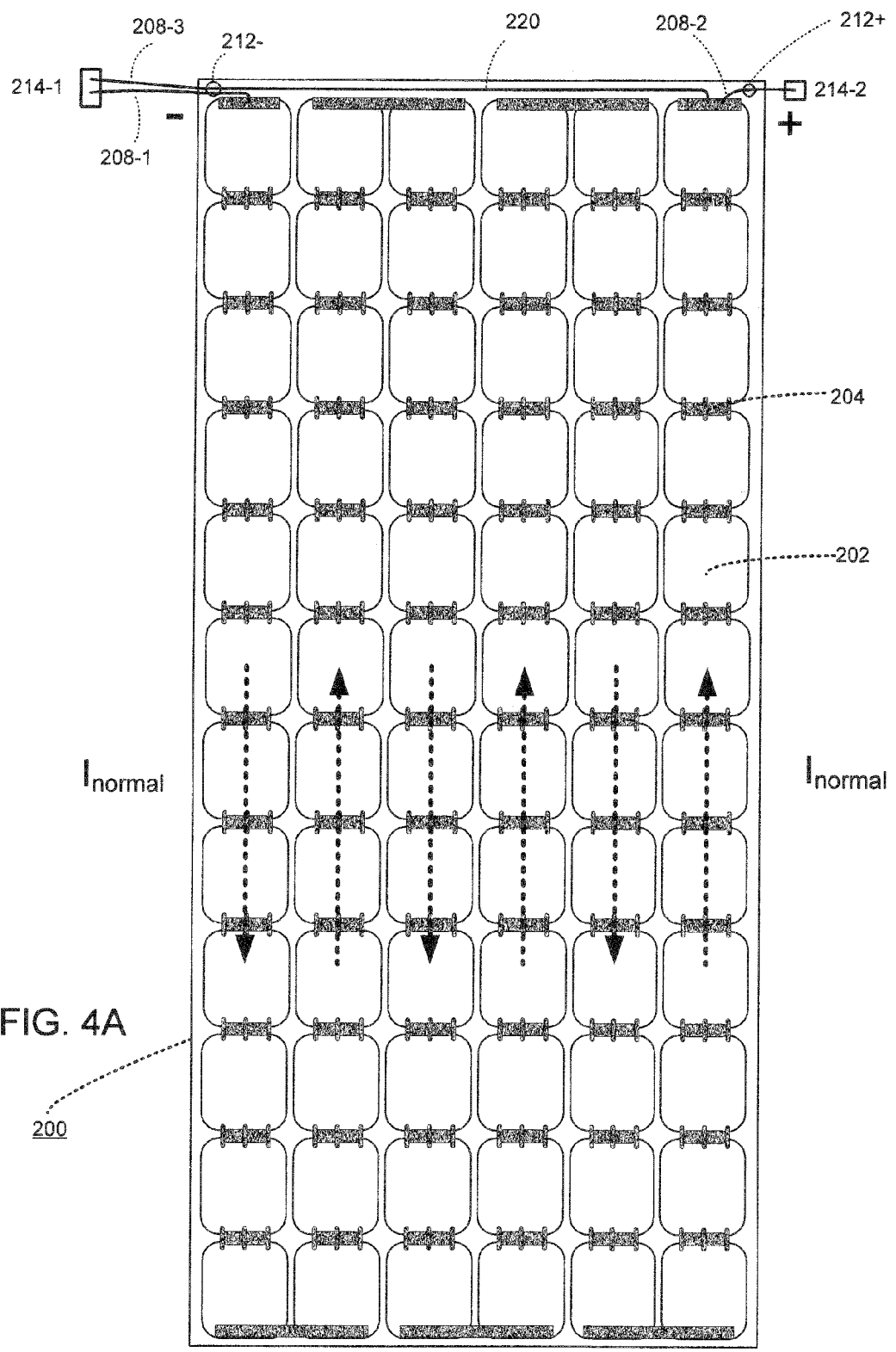
FIG. 4A is a schematic diagram showing the photovoltaic laminate of FIG. 2 in a normal operation mode.

FIG. 4A is a schematic diagram showing the photovoltaic laminate 200 of FIG. 2 in a normal operation mode. In this normal (non-bypass) operation mode, electrical current $I_{normal}$ flows in from the first electrical conductor 208-1 at a negative polarity end, through the series of solar cells in the string, and out of the second electrical conductor 208-2 at a positive polarity end.

Figure 4B:
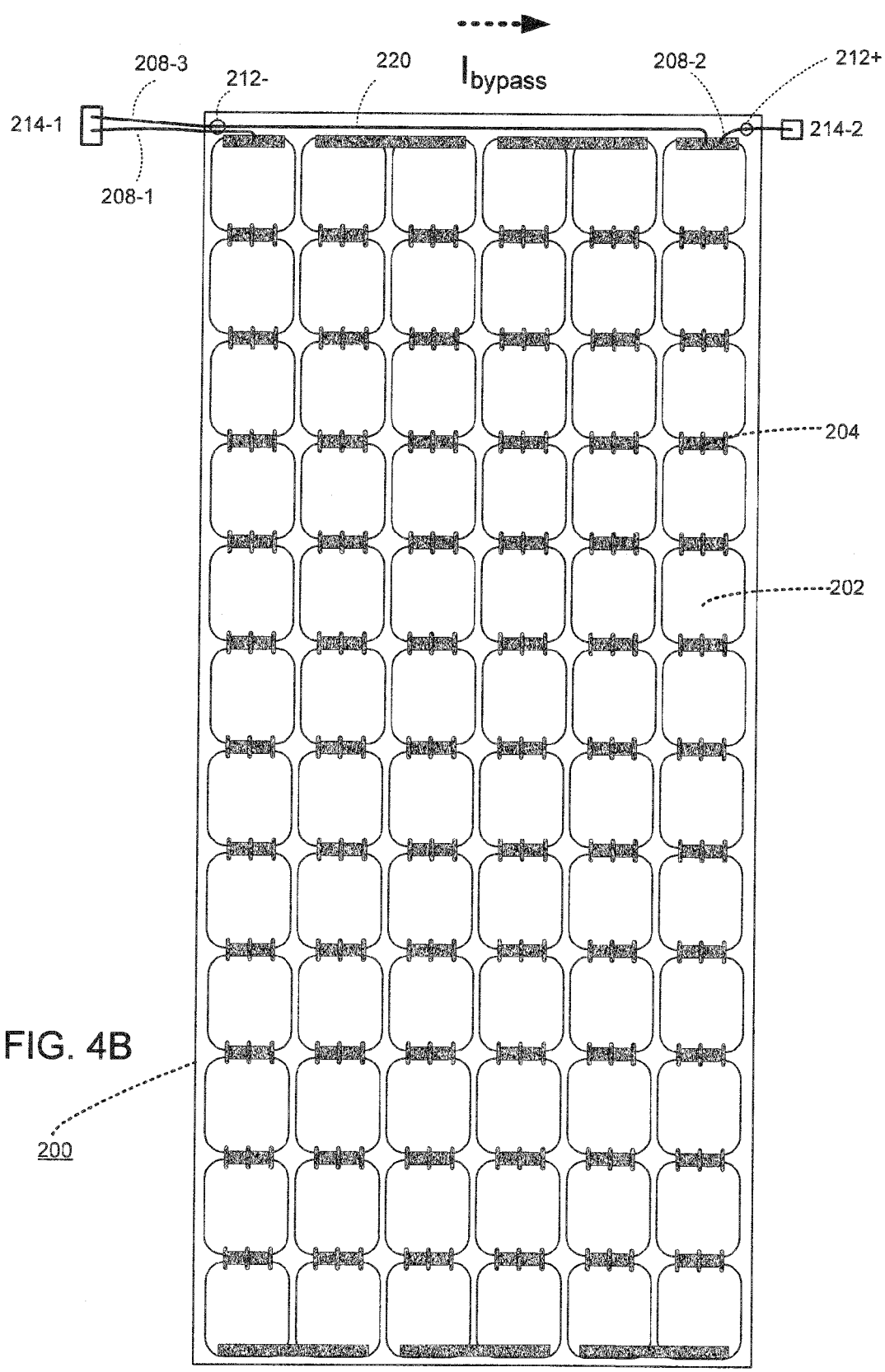
FIG. 4B is a schematic diagram showing the photovoltaic laminate of FIG. 2 in a bypass operation mode.

FIG. 4B is a schematic diagram showing the photovoltaic laminate 200 of FIG. 2 in a bypass operation mode. In this bypass operation mode, electrical current does not flow through the string of solar cells. Rather, the electrical current $I_{bypass}$ flows in from the third electrical conductor 208-3 at a negative polarity end, bypasses the string of solar cells, and flows out of the second electrical conductor 208-2 at a positive polarity end.

FIG. 5A is a schematic diagram showing the diode-included connector 100 of FIG. 1 in a normal (non-bypass) operation mode. In particular, the diode-included connector 100 is in this normal operation mode when the photovoltaic laminate 200 connected to the first connector 114-1 is in a normal operation mode. Because the photovoltaic laminate 200 connected to the first connector 114-1 is in a normal operation mode, the diode device 102 is reverse biased. As such, electrical current $I_{normal}$ flows in from the second electrical connection 108-2 and out of the first electrical connection 108-1. In other words, the diode-included connector 100 is in the normal operation mode when the voltage at 108-2 is higher than the voltage at 108-1.

FIG. 5B is a schematic diagram showing the diode-included connector of FIG. 1 in a bypass operation mode. The diode-included connector 100 may be in a bypass operation mode because the photovoltaic laminate 200 connected to the first connector 114-1 is operating at low voltage due to shading reducing the light shining on the solar cells, for example. Because the photovoltaic laminate 200 connected to the first connector 114-1 is operating at a low voltage, the diode device 102 may become forward biased. When the diode device 102 becomes forward biased, the electrical current $I_{bypass}$ flows in from the second electrical connection 108-2, through the diode device 102, and out of the third electrical connection 108-3. In other words, the diode-included connector 100 is in the bypass operation mode when the voltage at 108-2 is not higher than the voltage at 108-1.

Figure 6:
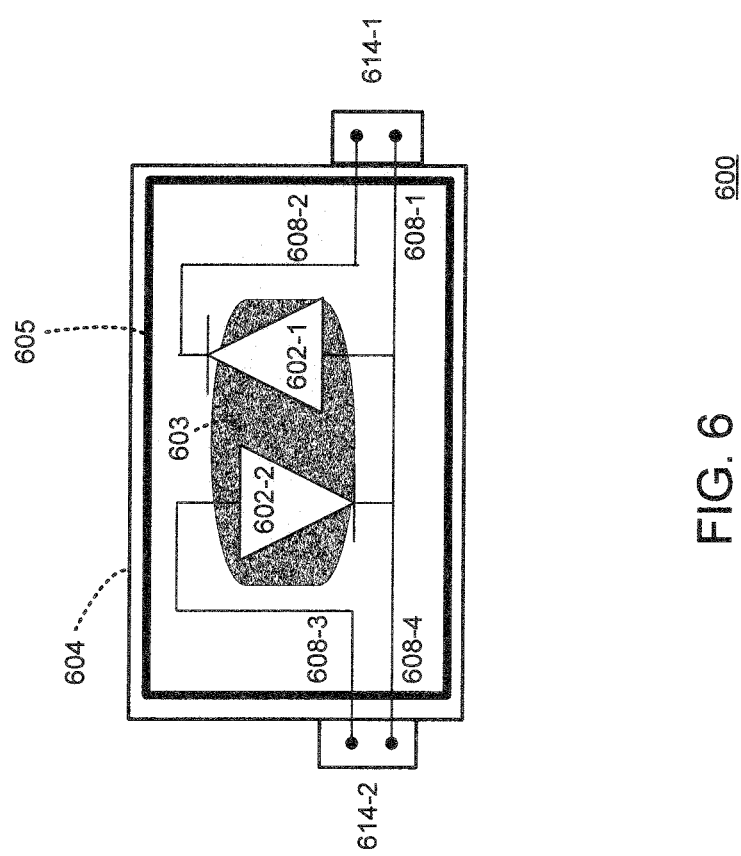
FIG. 6 is a schematic diagram of a diode-included connector in accordance with a second embodiment of the invention.

FIG. 6 is a schematic diagram of a diode-included connector 600 in accordance with a second embodiment of the invention. As shown, the diode-included connector 600 may include two diode devices (602-1 and 602-2) in an environmentally-protected housing 604. For example, an O-ring 605 (or, alternatively, a potting material) may be used to prevent external moisture from entering the interior of the housing 104. Alternatively, an encapsulant (such as a potting material) may be inserted into the housing 604 to weatherize the connector 600. A strain relief mechanism may also be incorporated into the connector such that forces applied to the external conductors are not transferred to the internal connection points.

Each diode device (602-1 and 602-2) includes an anode and a cathode. A heat sink 603 may be thermally coupled to the diode devices (602-1 and 602-2) so as to provide passive cooling of the devices.

The diode-included connector 600 further includes a first electrical connection 608-1 which connects to the anode of a first diode 602-1 and the cathode of the second diode 602-2, a second electrical connection 608-2 which connects to the cathode of the first diode 602-1, a third electrical connection 608-3 which connects to the anode of the second diode 602-2, and a fourth electrical connection 608-4 which connects to the cathode of the second diode 602-2 and the anode of the first diode 602-1.

A first port 614-1 may be configured to electrically connect to the first and second electrical connections (608-1 and 608-2). A second port 614-2 may be configured to electrically connect to the third and fourth electrical connections (608-3 and 608-3). In one implementation, the first and second ports (614-1 and 614-2) may be configured as coaxial connectors so as to connect to coaxial cables (the cables and connectors being configured with sufficient amperage carrying capacity for the electrical current flowing through them during peak operation).

Figure 7:
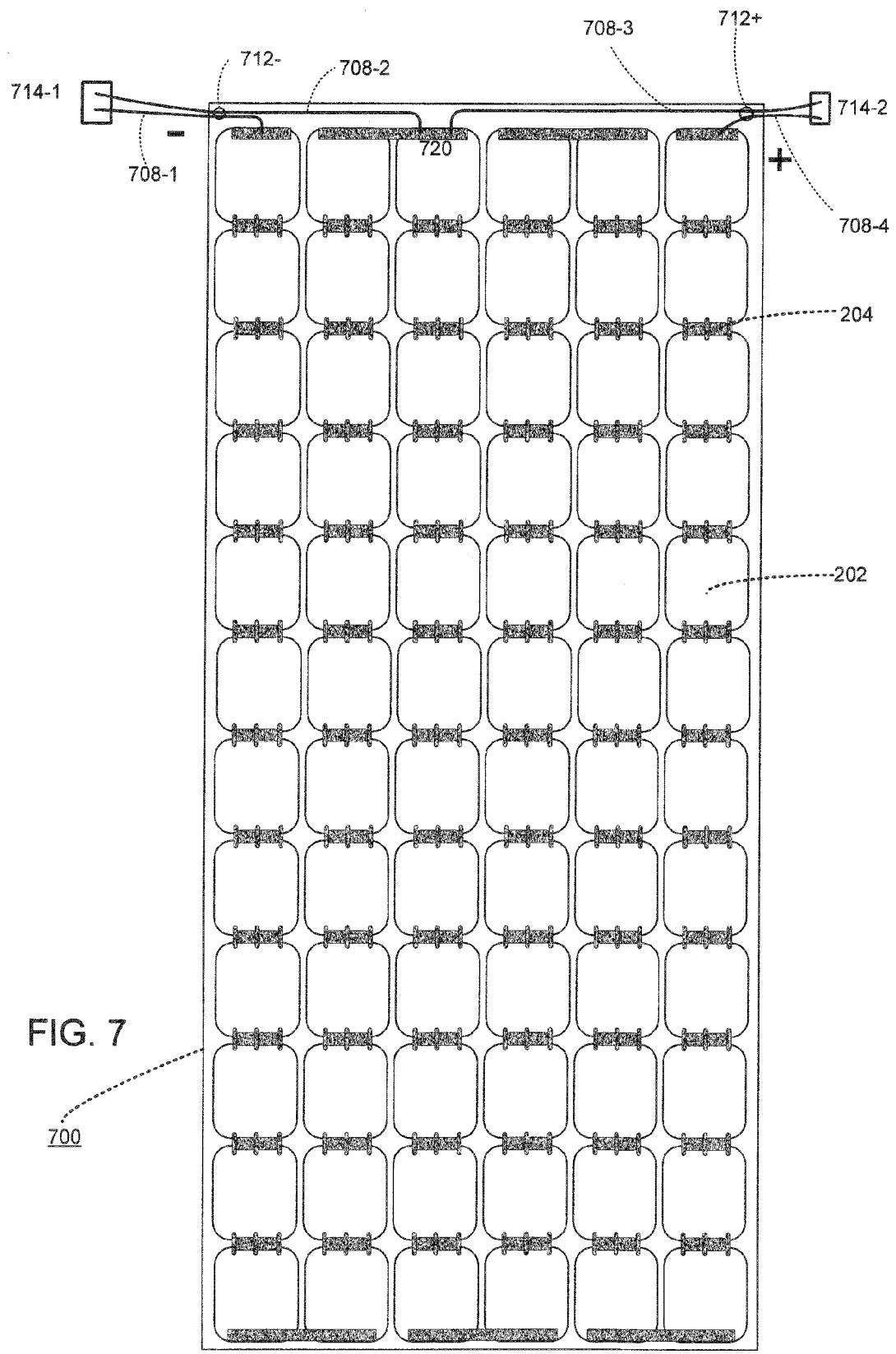
FIG. 7 is schematic diagram of a photovoltaic laminate in accordance with the second embodiment of the invention.

FIG. 7 is schematic diagram of a photovoltaic laminate 700 in accordance with the second embodiment of the invention. The photovoltaic laminate 700 includes a string of photovoltaic (solar) cells 202 connected in series. Each photovoltaic cell 202 in the string may be configured as a large-area PN-junction, and electrically-conductive interconnections 204 may be configured to connect to a negative connection point of one cell in the string to a positive connection point of the next cell in the string. A first end of the string may be at the negative polarity end (−) of the string, and a second end of the string may be at its positive polarity end (+).

In accordance with an embodiment of the invention, the photovoltaic laminate 700 may include a first discrete penetration 712− in a corner of the laminate near the first end (the negative polarity end) of the string and a second discrete penetration 712+ in a corner of the laminate near the second end (the positive polarity end) of the string. A sealant may be inserted into the first and second discrete penetrations (712− and 712+) so as to seal them from external moisture. A strain relief may also be incorporated into the discrete penetration such that forces applied to the external conductors are not transferred to the discrete connection point.

A first electrical conductor 708-1 may be electrically connected to the first end (−) of the string and may be configured to extend out of the first discrete penetration 712−. A second electrical conductor 708-2 may be electrically connected to an interior point 720 of the string and may be configured to also extend out of the first discrete penetration 712−. A third electrical conductor 708-3 may be electrically connected to the interior point 720 of the string and may be configured to extend out of the second discrete penetration 712+. Finally, a fourth electrical conductor 708-4 may be electrically connected to the second end (+) of the string and may be configured to also extend out of the second discrete penetration 712+. The electrical conductors 708-3 and 708-4 may comprise, at least in part, a metal bus bar embedded in the laminate. An alternate embodiment which utilizes an external cable, instead of an internal bus bar, is described below in relation to FIGS. 14-16.

While a particular interior point 720 in the string of solar cells 202 is shown in FIG. 7 for purposes of illustration, the interior point 720 may be located between any two solar cells 202 in the string. Moreover, while connections to one interior point 720 are depicted in FIG. 7 and described in detail herein, other alternate embodiments may utilize connections to multiple interior points 720. Each additional interior point 720 that is utilized would require an additional bypass diode 602 so as to be capable of independently bypassing an additional section of the string.

In one implementation, a first connector 714-1 may be configured at an end of the first and second electrical conductors (708-1 and 708-2). The first connector 714-1 may be of a type so as to connect with the first port 614-1 of the diode-included connector 600 of FIG. 6. For example, if the first port 614-1 is a female coaxial-type connector, then the first connector 714-1 may be matching male coaxial-type connector. When the first connector 714-1 and first port 614-1 are connected, the first electrical conductor 708-1 is connected to the first electrical connection 608-1, and the second electrical conductor 708-2 is connected to the second electrical connection 608-2.

In addition, a second connector 714-2 may be configured at an end of the third and fourth conductors (708-3 and 708-4). The second connector 714-2 may be of a type so as to connect with the second port 614-2 of the diode-included connector 600 of FIG. 6. For example, if the second port 614-2 is a female coaxial-type connector, then the second connector 714-2 may be matching male coaxial-type connector. When the second connector 714-2 and the second port 614-2 are connected, the third electrical conductor 708-3 is connected to the third electrical connection 608-3, and the fourth electrical conductor 708-4 is connected to the fourth electrical connection 608-4.

Figure 8:
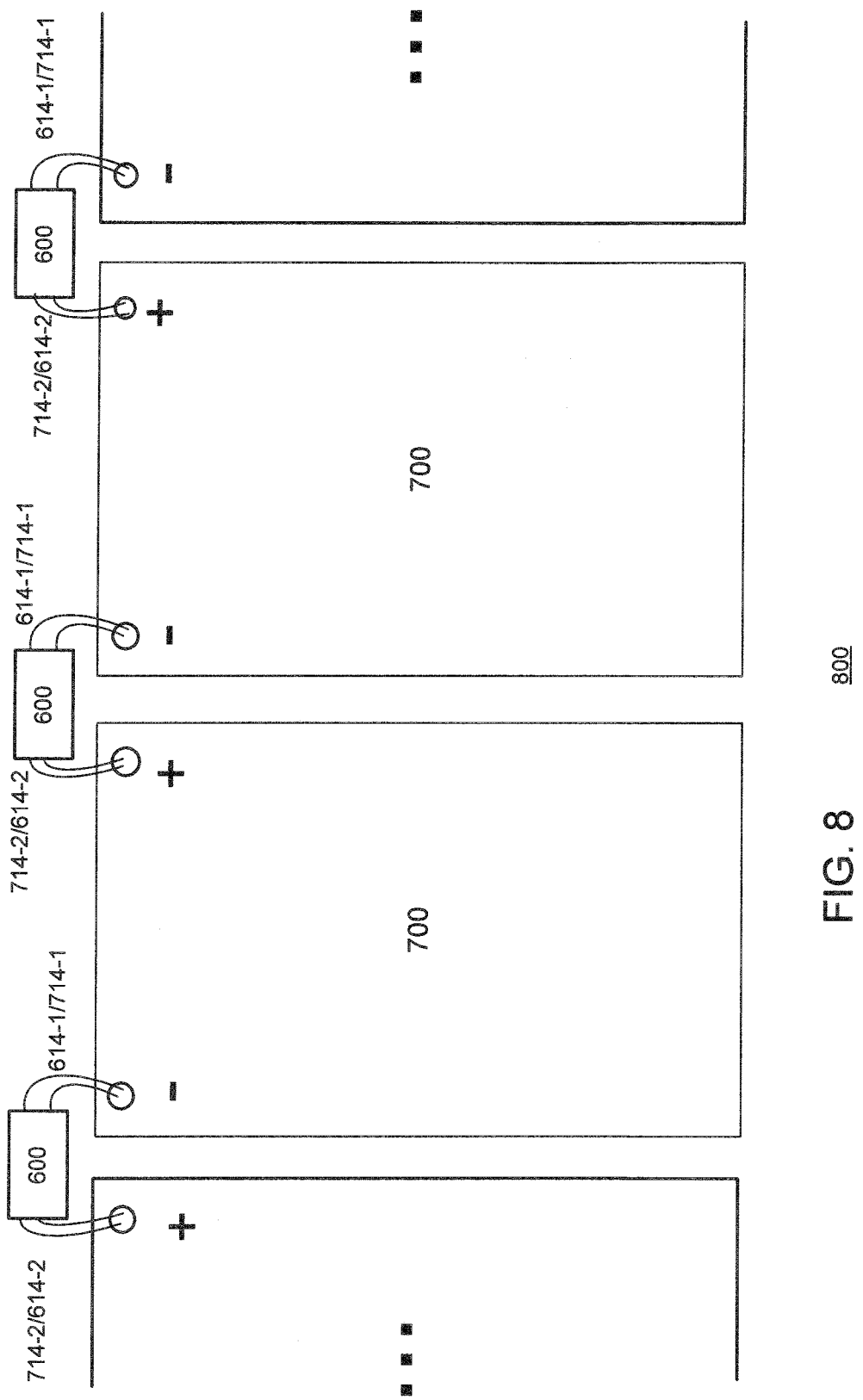
FIG. 8 is schematic diagram of a photovoltaic assembly in accordance with the second embodiment of the invention.

FIG. 8 is schematic diagram of a photovoltaic assembly 800 in accordance with the second embodiment of the invention. As shown, a plurality of photovoltaic laminates 700, each generally configured within a solar module, are connected in series using the diode-included connectors 600. As indicated, each diode-included connector 600 has a first port 614-1 which is connected to the first connector 714-1 of a photovoltaic laminate 700 (to the right of the connector in the figure) and a second port 614-2 which is connected to the second connector 714-2 of another photovoltaic laminate 700 (to the left of the connector in the figure).

The photovoltaic laminate 700 of FIG. 7 may operate in one of four modes: normal operation, full bypass, first partial bypass and second partial bypass. Normal operation mode is similar to that described above in relation to FIG. 4A, and full bypass mode is similar to that described above in relation to FIG. 4B. In normal operation mode, electrical current $I_{normal}$ flows in from the first electrical conductor 708-1 at the negative polarity end, through the series of solar cells in the string, and out of the fourth electrical conductor 708-4 at the positive polarity end. In full bypass mode, electrical current does not flow through the string of solar cells. Rather, the electrical current $I_{bypass}$ flows in from the second electrical conductor 708-2 at the negative polarity end, bypasses the string of solar cells, and flows out of the third electrical conductor 708-3 at the positive polarity end.

Figure 9A:
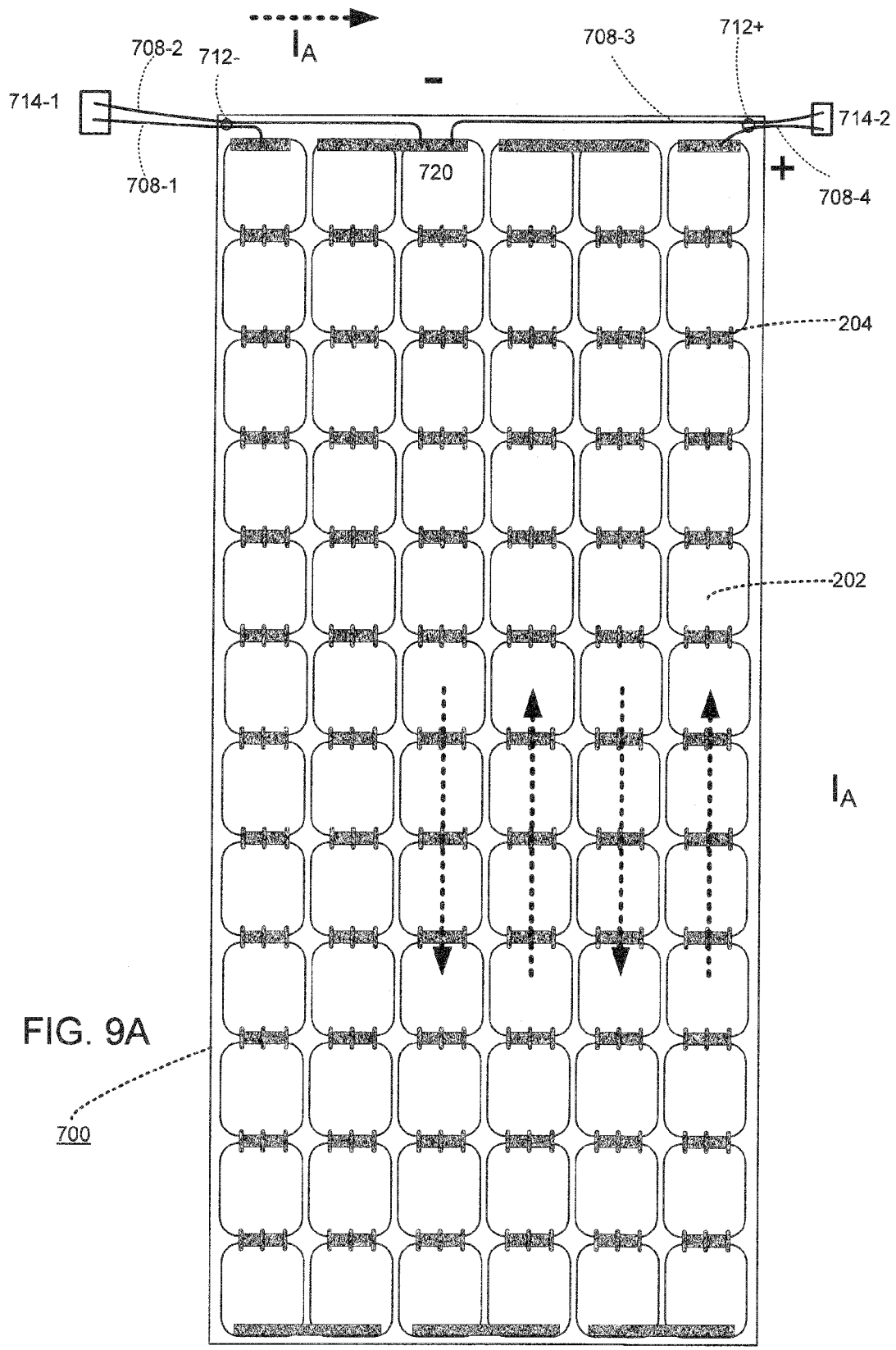
FIG. 9A is a schematic diagram showing the photovoltaic laminate of FIG. 7 in a first partial bypass mode.

FIG. 9A is a schematic diagram showing the photovoltaic laminate 700 of FIG. 7 in a first partial bypass mode. In this first partial bypass mode, the leftmost two columns of solar cells 202 are bypassed, but the rightmost four columns are not. For example, a partial shading of the laminate which covers a substantial portion of the leftmost two columns (while leaving the rightmost four columns mostly unshaded) may cause the laminate to enter into this mode.

Instead of flowing through the leftmost two columns of the string of solar cells, the electrical current $I_A$ flows in from the second electrical conductor 708-2 at the negative polarity end, bypasses the first two columns, and flows to the interior point 720 in the string. From the interior point 720, the electrical current $I_A$ flows through the rightmost four columns of the string of solar cells and out of the fourth electrical conductor 708-4 at the positive polarity end.

Figure 9B:
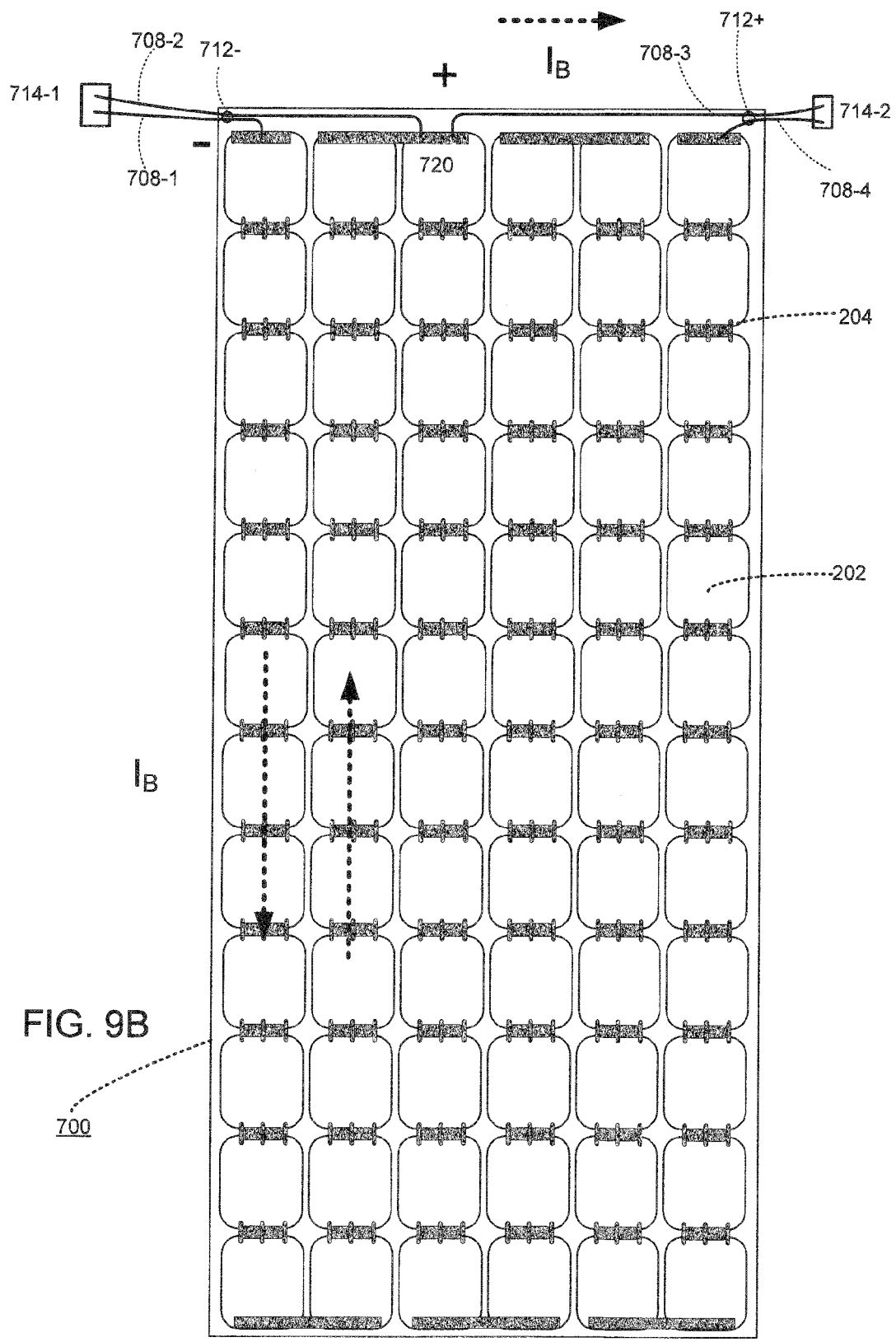
FIG. 9B is a schematic diagram showing the photovoltaic laminate of FIG. 7 in a second partial bypass mode.

FIG. 9B is a schematic diagram showing the photovoltaic laminate of FIG. 7 in a second partial bypass operation mode. In this second partial bypass mode, the leftmost two columns of solar cells 202 are not bypassed, but the rightmost four columns are bypassed. For example, a partial shading of the laminate which covers a substantial portion of the rightmost four columns (while leaving the leftmost two columns mostly unshaded) may cause the laminate to enter into this mode.

Electrical current $I_B$ flows in from the first electrical conductor 708-1 at the negative polarity end and through the first two columns of solar cells in the string to reach the interior point 720. Thereafter, instead of flowing through the rightmost four columns of the string of solar cells, the electrical current $I_B$ flows out through the third electrical conductor 708-3 so as to bypasses the rightmost four columns of solar cells.

FIG. 10A is a schematic diagram showing the diode-included connector 600 of FIG. 6 in the first partial bypass mode. The diode-included connector 600 may be in the first partial bypass mode because, for example, the leftmost two columns of the photovoltaic laminate 700 connected to the first connector 614-1 are substantially shaded, while the rightmost four columns of the photovoltaic laminate 700 connected to the second connector 614-2 are mostly unshaded. As such, the first diode device 602-1 may become forward biased, while the second diode device 602-2 remains reverse biased. Hence, the electrical current $I_A$ flows in from the fourth electrical connection 608-4, through the first diode device 602-1, and out of the second electrical connection 608-2.

FIG. 10B is a schematic diagram showing the diode-included connector 600 of FIG. 6 in a second partial bypass mode. The diode-included connector 600 may be in the second partial bypass mode because, for example, the leftmost two columns of the photovoltaic laminate 700 connected to the first connector 614-1 are mostly unshaded, while the rightmost four columns of the photovoltaic laminate 700 connected to the second connector 614-2 are substantially shaded. As such, the second diode device 602-2 may become forward biased, while the first diode device 602-1 remains reverse biased. Hence, the electrical current $I_B$ flows in from the third electrical connection 608-3, through the second diode device 602-2, and out of the first electrical connection 608-1.

Figure 11:
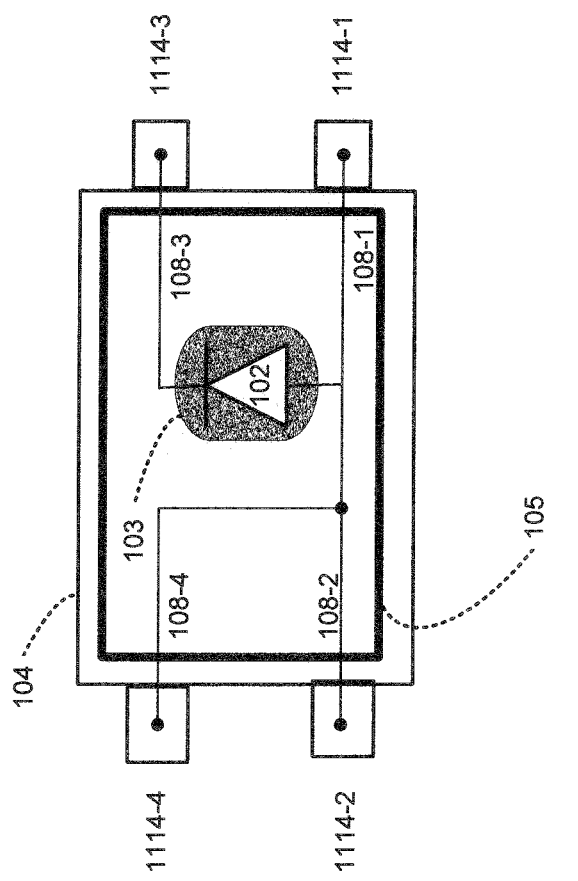
FIG. 11 is a schematic diagram of a diode-included connector in accordance with a third embodiment of the invention.

FIG. 11 is a schematic diagram of a diode-included connector 1100 in accordance with a third embodiment of the invention. In comparison to the diode-included connector 100 of FIG. 1, the diode-included connector 1100 of FIG. 11 has four ports, labeled 1114-1, 1114-2, 1114-3, and 1114-4. The first port 1114-1 is coupled by a first electrical connection 108-1 to the anode of the diode device 102. The second port 1114-2 is coupled by a second electrical connection 108-2 to the anode of the diode device 102. The third port 1114-3 is coupled by a third electrical connection 108-3 to the cathode of the diode device 102. Finally, the fourth port 1114-4 is coupled by a fourth electrical connection 108-4 to the anode of the diode device 102. The first, second and fourth electrical connections are effectively connected to each other as they are each connected to the anode. In accordance with the implementation shown in FIG. 11, the first and third ports (1114-1 and 1114-3) are located on a first side of the diode-included connector 1100, and the second and fourth ports (1114-2 and 1114-4) are located on a second (opposite) side of the diode-included connector 1100.

Figure 12:
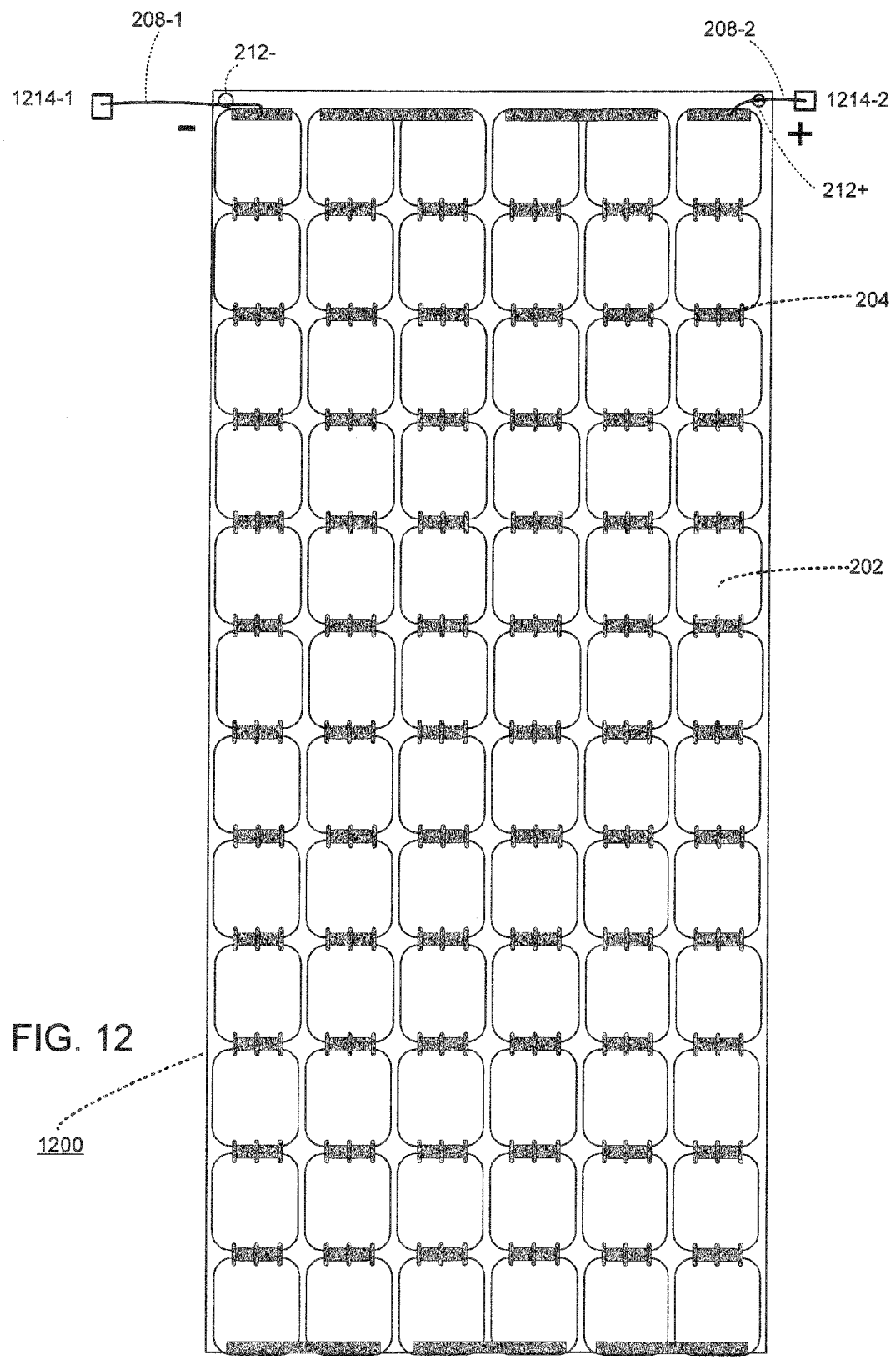
FIG. 12 is schematic diagram of a photovoltaic laminate in accordance with the third embodiment of the invention.

FIG. 12 is schematic diagram of a photovoltaic laminate 1200 in accordance with the third embodiment of the invention. The photovoltaic laminate 1200 of FIG. 12 comprises a first connector 1214-1 which is electrically connected via a first electrical conductor 208-1 to the first end of the string of solar cells (the negative polarity end) and a second electrical connector 1214-2 which is electrically connected via a second electrical conductor 208-2 to the second end of the string (the positive polarity end). The first electrical conductor 208-1 extends out of the first discrete penetration 212−, and the second electrical conductor 208-2 extends out of the second discrete penetration 212+. In comparison to the photovoltaic laminate 200 of FIG. 2, the photovoltaic laminate 1200 of FIG. 12 does not need the internal bus bar 220 and the third electrical conductor 208-3.

Figure 13:
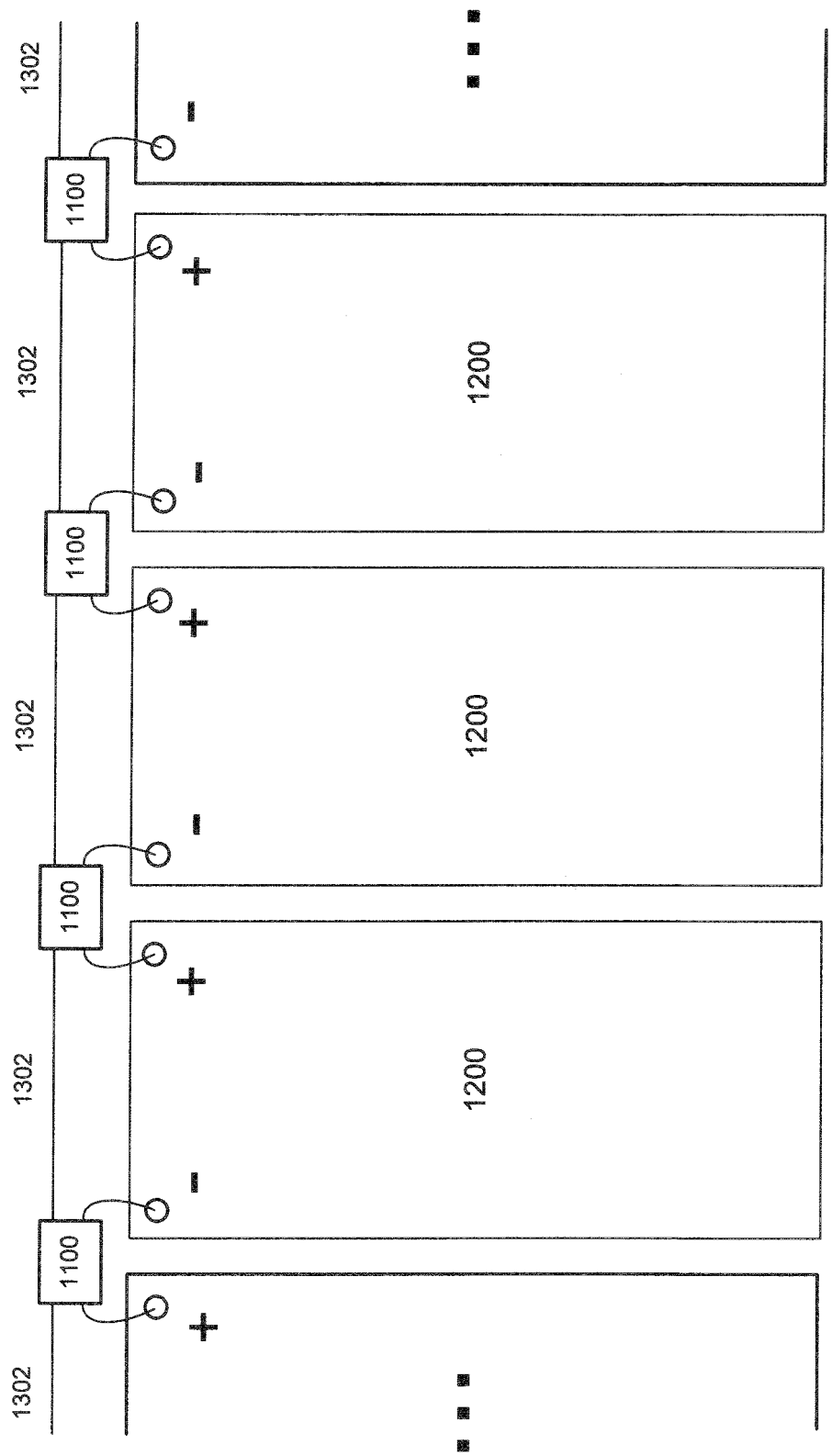
FIG. 13 is schematic diagram of a photovoltaic assembly in accordance with the third embodiment of the invention.

FIG. 13 is schematic diagram of a photovoltaic assembly 1300 in accordance with the third embodiment of the invention. As shown, each diode-included connector 1100 is used to interconnect two photovoltaic laminates 1200. Each diode-included connector 1100 has its first port 1114-1 electrically connected to the first electrical connector 1214-1 of the photovoltaic laminate 1200 on its first side and has its second port 1114-2 electrically connected to the second electrical connector 1214-2 of the photovoltaic laminate 1200 on its second side. An external cable is used to electrically connect the third port 1114-3 on the first side of a diode-included connector 1100 to the fourth port 1114-4 on the second side of a next diode-included connector 1100.

Once interconnected as described above, the photovoltaic assembly 1300 of FIG. 13 operates in a similar manner to the operation of the photovoltaic assembly 300 of FIG. 3. However, instead of the bypass current going through the internal bus bar 220, it goes through the external cable 1302.

Figure 14:
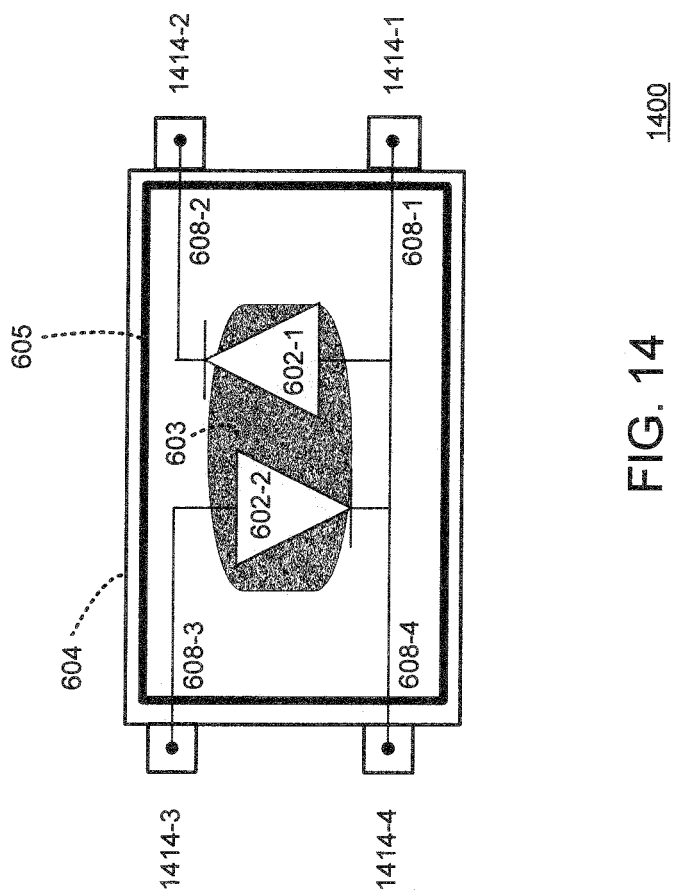
FIG. 14 is a schematic diagram of a diode-included connector in accordance with a fourth embodiment of the invention.

FIG. 14 is a schematic diagram of a diode-included connector in accordance with a fourth embodiment of the invention. In comparison to the diode-included connector 600 of FIG. 6, the diode-included connector 1400 of FIG. 14 has four ports, labeled 1414-1, 1414-2, 1414-3, and 1414-4. The first port 1414-1 is coupled by a first electrical connection 608-1 to the anode of the first diode device 602-1 and the cathode of the second diode device 602-2. The second port 1414-2 is coupled by a second electrical connection 608-2 to the cathode of the first diode device 602-1. The third port 1414-3 is coupled by a third electrical connection 608-3 to the anode of the second diode device 602. Finally, the fourth port 1114-4 is coupled by a fourth electrical connection 608-4 to the anode of the first diode device 602-1 and the cathode of the second diode device 602-2. The first and fourth electrical connections are effectively connected to each other. In accordance with the implementation shown in FIG. 14, the first and second ports (1414-1 and 1414-2) are located on a first side of the diode-included connector 1400, and the third and fourth ports (1414-3 and 1414-4) are located on a second (opposite) side of the diode-included connector 1400.

Figure 15:
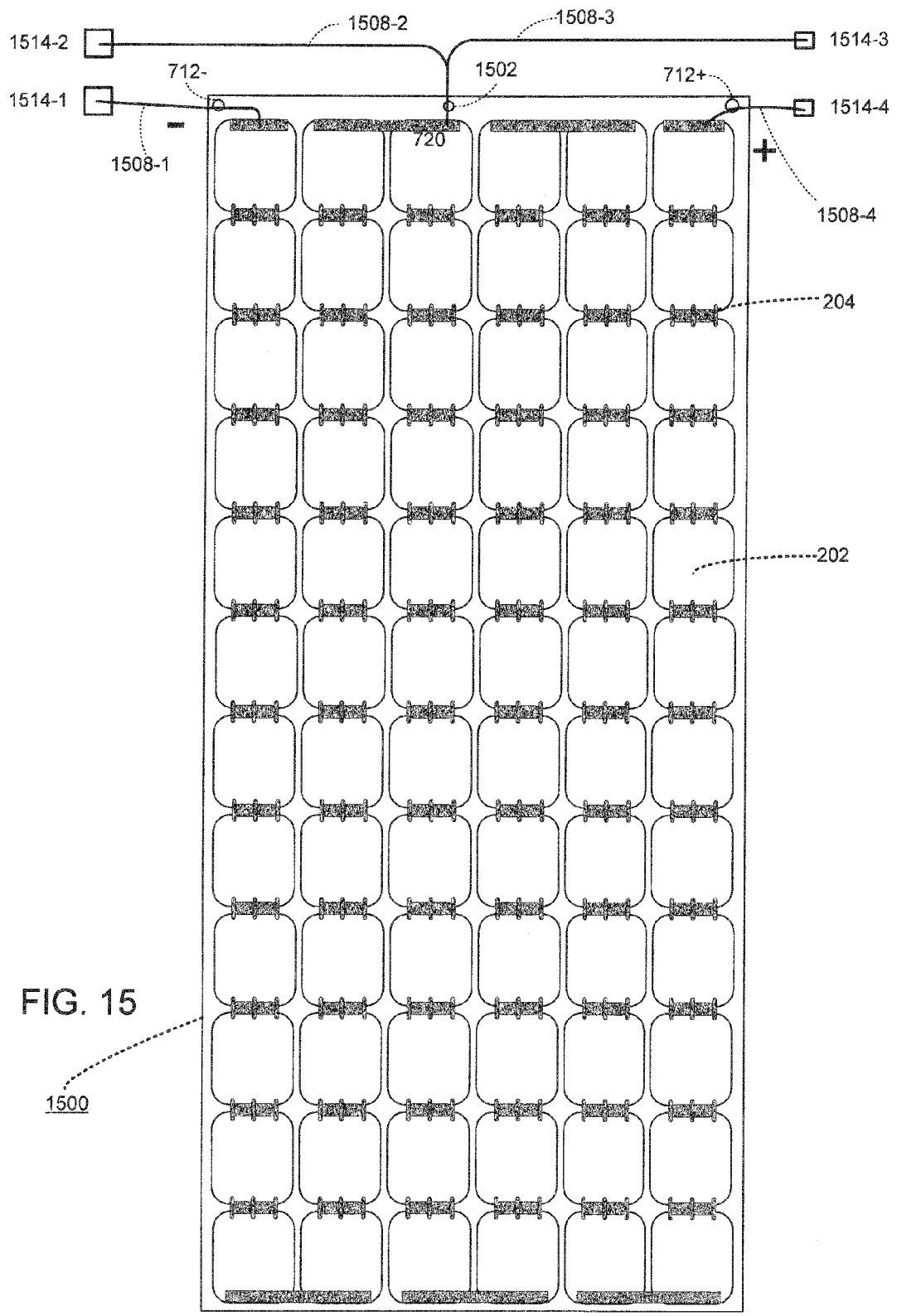
FIG. 15 is schematic diagram of a photovoltaic laminate in accordance with the fourth embodiment of the invention.

FIG. 15 is schematic diagram of a photovoltaic laminate 1500 in accordance with the fourth embodiment of the invention. The photovoltaic laminate 1500 of FIG. 15 comprises a first connector 1514-1 which is electrically connected via a first electrical conductor 1508-1 to the first end of the string of solar cells (the negative polarity end) and a fourth electrical connector 1514-4 which is electrically connected via a fourth electrical conductor 1508-4 to the second end of the string (the positive polarity end). The first electrical conductor 1508-1 extends out of a first discrete penetration 1512− (which may be near the negative polarity end of the string), and the fourth electrical conductor 1508-4 extends out of a second discrete penetration 1512+ (which may be near the positive polarity end of the string). In addition, a second connector 1514-2 is electrically connected via a second electrical conductor 1508-2 to an interior point 720 of the string, and a third connector 1514-3 is electrically connected via a third electrical conductor 1508-3 to the same interior point 720 of the string. The second and third electrical conductors (1508-2 and 1508-3) may extend out of a third discrete penetration 1502 (which may be near the interior point of the string). The electrical conductors (1508-1, 1508-2, 1508-3, and 1508-4) may comprise insulated wires or cables.

Figure 16:
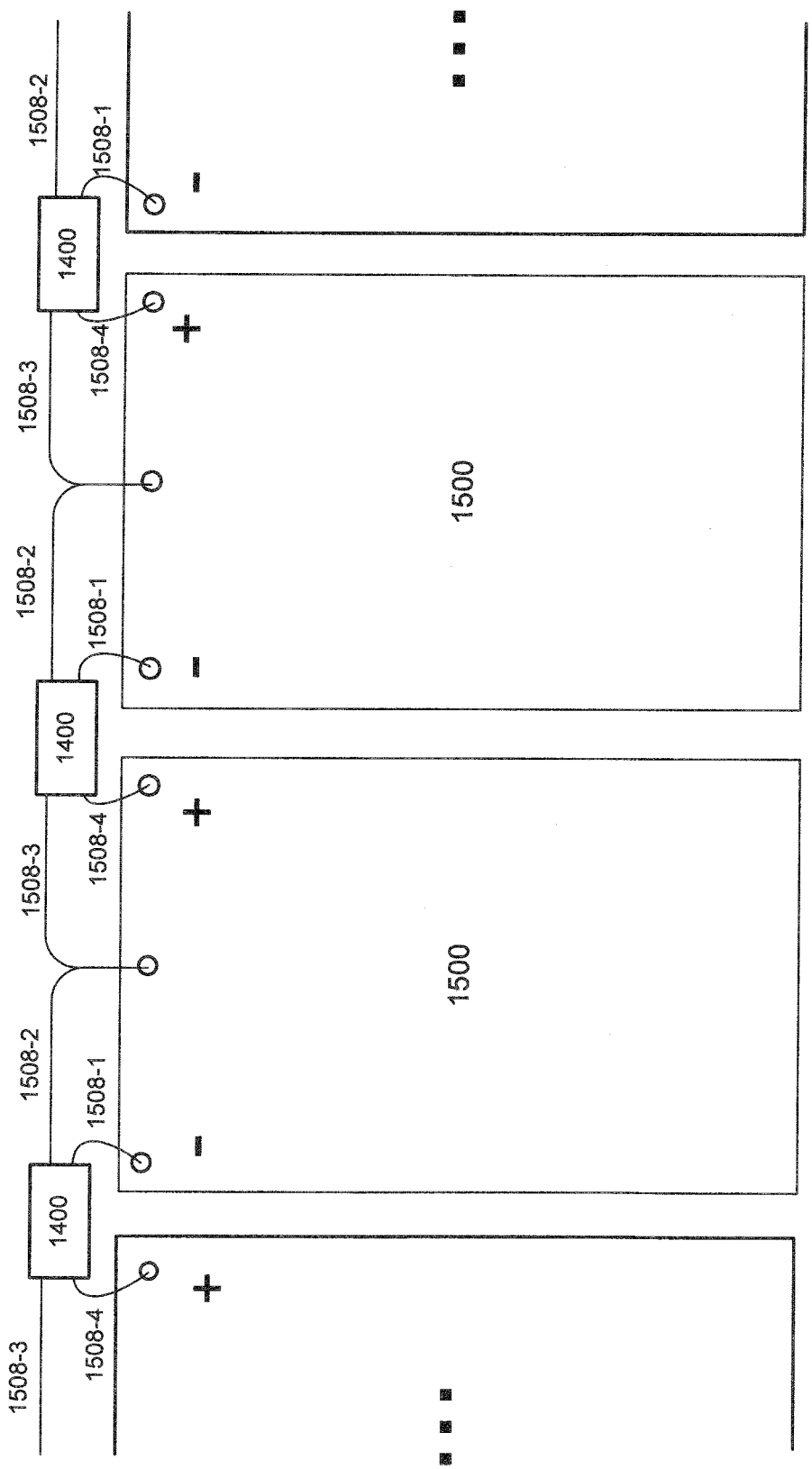
FIG. 16 is schematic diagram of a photovoltaic assembly in accordance with the fourth embodiment of the invention.

FIG. 16 is schematic diagram of a photovoltaic assembly 1600 in accordance with the fourth embodiment of the invention. As shown, each diode-included connector 1400 is used to interconnect two photovoltaic laminates 1500. Each diode-included connector 1400 has its first and second ports (1414-1 and 1414-2) electrically connected to the first and second electrical connectors (1514-1 and 1514-2), respectively, of the photovoltaic laminate 1500 on its first side. Each diode-included connector 1400 has its third and fourth ports (1414-3 and 1414-4) electrically connected to the third and fourth electrical connectors (1514-3 and 1514-4), respectively, of the photovoltaic laminate 1500 on its second side.

Once interconnected as described above, the photovoltaic assembly 1600 of FIG. 16 operates in a similar manner to the operation of the photovoltaic assembly 800 of FIG. 8. However, instead of the bypass current going through the wires or cables (708-2 and 708-3) embedded in the laminate, it goes through the external wires or cables (1508-2 and 1508-3).

In the present disclosure, numerous specific details are provided, such as examples of apparatus, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

While specific embodiments of the present invention have been provided, it is to be understood that these embodiments are for illustration purposes and not limiting. Many additional embodiments will be apparent to persons of ordinary skill in the art reading this disclosure.

What is claimed is:

1. A diode-included connector comprising:
   first and second diodes, each having an anode and a cathode;
   a housing containing the first and second diodes;
   a first electrical connection which connects directly to the anode of the first diode and directly to the cathode of the second diode within the housing;
   a second electrical connection which connects directly to the cathode of the first diode within the housing;
   a third electrical connection which connects directly to the anode of the second diode within the housing;
   a first port for electrically connecting from outside the housing directly to the first and second electrical connections; and
   a second port for electrically connecting from outside the housing directly to the third and first electrical connections.

2. The diode-included connector of claim 1, further comprising a seal to protect the diode and the first, second and third electrical connections from external moisture.

3. The diode-included connector of claim 1, further comprising a heat sink that is thermally coupled to said diodes.

4. The diode-included connector of claim 1, wherein the first and second ports are each configured to attach to a coaxial cable.

\* \* \* \* \*